(12) United States Patent
Stevenson et al.

(10) Patent No.: US 6,702,968 B2
(45) Date of Patent: Mar. 9, 2004

(54) PRINTED CIRCUIT TECHNIQUES FOR POLYETHYLENE SURFACES

(75) Inventors: Michael J. Stevenson, 1200 Soldier Pass Rd., Sedona, AZ (US) 86336; Robert Alan Reeves, Cottonwood, AZ (US)

(73) Assignee: Michael J. Stevenson, Sedona, AZ (US)

( * ) Notice: Subject to any disclaimer, the term of this patent is extended or adjusted under 35 U.S.C. 154(b) by 57 days.

(21) Appl. No.: 09/953,629

(22) Filed: Sep. 17, 2001

(65) Prior Publication Data

US 2003/0051799 A1 Mar. 20, 2003

(51) Int. Cl.$^7$ ................................................. B29C 41/04
(52) U.S. Cl. ....................... 264/104; 264/132; 264/311; 156/240
(58) Field of Search ................................ 264/104, 129, 264/131, 132, 310, 311; 156/230, 240, 247, 277, 289; 427/146, 147, 148

(56) References Cited

U.S. PATENT DOCUMENTS

| | | | |
|---|---|---|---|
| 3,719,261 A | * 3/1973 | Heinzer et al. | .......... 400/118.3 |
| 4,239,796 A | 12/1980 | Shanoski et al. | |
| 4,252,762 A | 2/1981 | Stevenson | |
| 4,282,285 A | 8/1981 | Mohiuddin | |
| 4,356,230 A | 10/1982 | Emanuel et al. | |
| 4,389,454 A | 6/1983 | Horacek et al. | |
| 4,499,235 A | 2/1985 | Verwer et al. | |
| 4,519,972 A | 5/1985 | Stevenson | |
| 4,548,779 A | 10/1985 | Steinberg et al. | |
| 4,681,712 A | 7/1987 | Sakakibara et al. | |
| 4,980,107 A | 12/1990 | Falline et al. | |
| 4,980,113 A | 12/1990 | Cummings et al. | |
| 5,035,849 A | 7/1991 | Uemura et al. | |
| 5,648,030 A | * 7/1997 | Pemberton et al. | ........... 264/71 |
| 5,746,961 A | 5/1998 | Stevenson et al. | |
| 5,840,142 A | 11/1998 | Stevenson | |
| 6,136,127 A | * 10/2000 | De Bastiani | ................. 156/230 |
| 6,297,564 B1 | * 10/2001 | Chung | ........................ 257/783 |

FOREIGN PATENT DOCUMENTS

| | | |
|---|---|---|
| EP | 562 716 A1 | 9/1993 |
| GB | 917844 | 2/1963 |
| JP | 110459 | 8/1975 |
| JP | 48-42211 | 10/1980 |

* cited by examiner

*Primary Examiner*—Mark Eashoo
(74) *Attorney, Agent, or Firm*—Robert E. Strauss

(57) ABSTRACT

Electrical circuit elements such as electrically conductive strips are permanently applied to the surface of polyolefin parts, such as polyethylene parts which are manufactured by rotational molding, by use of a transfer which can be applied to the interior surface of a rotational mold at the start of the molding cycle or can be applied to the molded part after its formation. The transfer comprises a carrier sheet on which the conductive circuit elements are printed with a mixture of wax or polyethylene powders containing from 30 to about 60 weight percent of conductive particles, preferably metal flakes. After application, the carrier sheet is removed and the conductive circuit elements are permanently incorporated into the surface of the polyethylene part by heating, either during the rotational molding cycle or by post-cycle heating of the formed part.

10 Claims, No Drawings

PRINTED CIRCUIT TECHNIQUES FOR POLYETHYLENE SURFACES

BACKGROUND OF THE INVENTION

1. Field of Invention

This invention relates to molded polyethylene parts and, in particular, to a method for permanently coating polyethylene surfaces with electrically conductive circuits.

2. Brief Statement of the Prior Art

Surfaces of polyolefins, particularly polyethylene, are very non-receptive to coatings such as paints, inks and the like. Consequently, it is very difficult to apply a layer of electrically conductive elements in a permanently secure manner to the polymer surface.

The polyolefins, particularly polyethylene, are ubiquitously used for rotational molding of large, hollow-form parts such as tanks, boxes, children's toys, outdoor signs, etc. In some of these applications, it is desirable to include electrically conductive elements on the surfaces of the molded part. In one application for liquid storage tanks, electrically conductive, adhesive tapes have been applied along the vertical axis of the tanks to incorporate a liquid level sensing system. The use of adhesive tape for this application has not been successful since none has been found that will permanently bond to the polymer surface.

U.S. Pat. No. 4,352,762 describes and claims a method in which decorative or alphanumerical indicia are applied as a viscous oil suspension to the interior surface of a rotational mold by silk screen printing for transfer to the molded part during molding. Further developments of this approach have included using transfers having indicia contained in a mixture of waxy material and polyolefin powders printed on a carrier sheet to apply the indicia onto the interior surface of the mold; see U.S. Pat. No. 4,519,972. U.S. Patent discloses and claims a method for the application of indicia to the surface of a molded polyolefin part using a similar transfer. These developments spurned other developments such as disclosed in U.S. Pat. Nos. 5,648,030 and 5,498,307.

None of the aforementioned approaches has addressed the problems and objectives in permanently coating polyethylene surfaces with electrically conductive circuits which would be useful for a variety of applications such as level sensors for liquid storage tanks, static charge reducers, etc. These applications typically require low voltage circuitry and comparatively high conductivities.

OBJECTIVES OF THE INVENTION

It is an objective of this invention to provide a method for the permanent application of electrical circuit elements to polyolefin, particularly polyethylene, parts.

It is an additional objective of this invention to apply the method for the permanent application of electrical circuit elements to polyolefin parts during rotational molding.

It is a further objective of this invention to provide the method for the permanent application of electrical circuit elements to polyolefin parts during their fabrication in a rotational molding cycle.

It is also an objective of this invention to provide electrical circuit elements which are integrated into the outer skin of polyolefin, particularly polyethylene, parts.

Other and related objectives will be apparent from the following description of the invention.

BRIEF DESCRIPTION OF THE INVENTION

Electrical circuit elements such as electrically conductive strips are permanently applied to the surface of polyolefin parts by use of a transfer which can be applied to the molded part after its formation by various conventional molding operations. In a specific application to rotational molding, the transfer can be applied to the interior surface of the rotational mold at the start of the molding cycle. The transfer comprises a carrier sheet on which the conductive circuit elements are printed with a mixture of wax or polyethylene powders containing from 30 to about 60 weight percent of conductive particles, preferably metal flakes. After application, the carrier sheet is removed and the conductive circuit elements are permanently incorporated into the surface of the polyethylene part by heating, either during the rotational molding cycle or by heating of the molded polyolefin part.

DESCRIPTION OF THE PREFERRED EMBODIMENTS

The invention is intended for incorporation of printed circuit elements in the surface of polyolefin parts. The invention can be applied as a post molding treatment of polyolefin parts which have been formed in conventional molding operations such as rotational molding, thermoforming, infection molding or blow molding. The invention can also be applied during a rotational molding cycle. In rotational molding, hollow-form plastic parts are formed by charging polyolefin particles to a rotational mold, closing and heating the mold to the molding temperature of the polyolefin while being rotating the mold about its major and minor axes for a time sufficient to form the molded part. The mold is then cooled to a demolding temperature, opened and the molded product is ejected.

The electrical circuit elements are printed on a carrier sheet to form a transfer using a heated metal screen and standard hot screen printing techniques. The carrier sheet useful for the transfer of this invention can be any flexible, dimensional stable paper such as parchment paper, or plastic film.

A mixture of conductive powders with wax particles or high density polyethylene powders is used to print the circuit elements onto the carrier sheet. Preferably the mixture contains these components in proportions suitable for screen printing such as from 45 to 70 weight percent wax or polyethylene powders and from 30 to 55 weight percent conductive powders. When the transfer is to be applied to the inside surface of the rotational mold, it is preferred to use a mixture of 45 to 55 weight percent conductive powders in microcrystalline wax. When the transfer is to be applied to the surface of a folded polyethylene part, it is preferred to use a mixture of 30 to 40 weight percent conductive powders in high density polyethylene powder. If desired, viscosity additives such as silica or silicates can be added in minor amounts to provide an optimum viscosity (100 to 1000 centipoise) for screen printing.

The conductive particles can be metal particles or metal coated cores of glass or ceramic particles, or can be carbon or graphite particles. Useful metals include tin, copper, nickel, silver and salts or oxides of the metals such as antimony doped tin oxide coated onto ceramic particles. Other specific examples include silver coated nickel particles, silver and silver chloride coated glass particles, etc. The particles should have a size range no greater than about 100 microns, preferably no greater than about 10–50 microns. The shape of the particles can be spherical, e.g., glass beads, however flake shapes are preferred. Most useful from a cost and efficiency standpoint are nickel flakes with a thickness of about 1 micron and 98 percent passing a 400 mesh screen.

The wax can be a hydrocarbon wax which is preferably transparent or lightly colored so as to avoid any coloration or shading. Examples of suitable waxes include natural waxes, paraffin wax, synthetic wax, microcrystalline wax, etc. Microcrystalline waxes are refined petroleum waxes that have been crystallized from solvents used to extract wax from highly paraffinic petroleum stocks. A very suitable wax is a microcrystalline wax having a melting point from 90 to 300 degrees F., preferably from 110 to 250 degrees F. and a molecular weight from 500 to 1000, preferably from 600 to 750. Plastic waxes are less refined and contain branched chain and cyclic hydrocarbons. Typically plastic waxes have hardness values and crystallinity less than those of microcrystalline waxes.

Paraffin wax comprises chiefly n-paraffin hydrocarbons having from 16 to 38 carbons with limited quantities of branched chain paraffins, monocyclic and polycyclic paraffins.

Synthetic hydrocarbon waxes are obtained by the polymerization and copolymerization of hydrocarbon olefins such as ethylene and propylene. Typically these synthetic waxes have molecular weights from 400 to about 3,000 with a narrow molecular weight distribution.

The high density polyethylene powders which are useful have densities from 0.90 to 1.1, preferably from 0.92 to 0.95. The particles of the powder have a size range less than 40 microns and readily form a viscous mixture with the conductive particles.

The transfer with the printed conductive elements can be applied to the inside surface of a rotational mold to incorporate the conductive elements into the outside surface of a molded part during its formation, or can be post-mold applied to a formed part.

The transfers are readily applied to the internal surface of molds used in rotational molding by orienting the transfer in the mold and pressing the outer surface of the carrier sheet against the surface of the mold. The transfers are applied during the molding cycle, after the previously formed part has been ejected from the mold and while the mold is at the demolding temperature, typically from 90 to 190 degrees F. The printed coating on the transfer adheres to the hot mold surface, releasing the carrier sheet, which is removed. Thereafter, the steps and conditions typically practiced with rotational molding can be practiced, i.e., charging the mold with molding resin, typically polyethylene resin particles with sizes from 16 to 60, usually 35 mesh, closing the mold and heating it to the molding temperatures while rotating the mold about its major and minor axes for the time and at the temperature conditions tailored for the particular product and molding resin. During the molding cycle, the conductive elements transfer to the part and become permanently incorporated into surface of the part. At the completion of the molding cycle, the mold is cooled, opened and the part is ejected.

The transfers can also be applied to a preformed part obtained by otherwise conventional molding such as rotational molding, thermoforming, blow molding, injection molding, etc., by laying the transfer against the part and pressing the carrier sheet tightly against the part, releasing the conductive elements as a coating on the part. The coated surface of the part is then heated to raise the temperature of the coating and outer skin of the surface to the melt temperature of the polyolefin powders, fusing the coating into the outer skin of the polyolefin surface. The conductive particles are thereby permanently bonded to the outer skin of the polyolefin part, yet remain in electrical contact with each other to provide an electrical path across the part. In a typical application, the coated polyolefin surface is heated to a temperature from 250 to about 350 degrees F., taking care to avoid excessive temperatures or temperature differentials which could cause the polyolefin part to distort or warp.

The heating can be accomplished using a suitable radiant source such as an open flame or a high temperature electrical heater, e.g., an infrared heater. The heating step is practiced to apply heat locally to the coated polyethylene surface sufficiently to fuse the coating into the surface of the polyolefin part, a condition which is reached when the coated surface appears to be clear of any cloudiness. Thereafter, the polyolefin part is cooled to ambient temperature.

The electrically conductive metal particles are intimately dispersed throughout the printed electrical element, establishing electrical continuity by edge to edge contact. It has been observed that the electrical continuity is temperature responsive, presumably the polyethylene surface will expand when heated sufficiently until edge to edge contact of the metal particles in the printed electrical element is lost. The electrical continuity is restored when the surface cools. This provides a unique application for the invention in the manufacture of heated plastic parts, as the electrical elements have an inherent thermostatic control in which the temperature at which electrical continuity is lost can be determined by the concentration of the metal particles in the coating.

The invention is further described and illustrated in the following examples

EXAMPLE 1

The invention is used to mold conductive strips onto a polyethylene tank during its formation in rotational molding. The tank is approximately 12 inches high and has a three-gallon capacity. Two transfers are printed each with a conductive strip, 1.5 by 10 inches, on a paper carrier using a mixture of 50 weight percent nickel flakes and 50 weight percent of a microcrystalline wax. The nickel flakes have a size range from 10 to 20 microns in width and are approximately 1 micron in thickness. The transfers are laid, parallel and spaced apart by about 2 inches and centered vertically on a vertical wall of the rotational mold which is at demolding temperature, approximately 120 degrees F. The transfers are pressed against the surface of the mold to release the carrier sheets and the mold is then charged with polyethylene molding resin (35 mesh), closed and heated to approximately 550 degrees F., while being rotated about its major and minor axes for 15 minutes. The mold is then cooled, opened and the tank is ejected. The conductive strips are molded into the outer surface of the tank flush with the tank surface. Electrical connection to the strips is achieved by the application of a tab of electrically conductive adhesive tape to each strip.

EXAMPLE 2

The invention is used to apply conductive strips on the exterior surface of a liquid storage tank molded of polyethylene. The tank is approximately 12 inches high and has a twenty-gallon capacity. It is desired to apply two conductive strips in a parallel array on a vertical side of the tank to function as liquid level sensors. Two transfers are printed each with a conductive strip, 1.5 by 10 inches, on a paper carrier using a mixture of 35 weight percent nickel flakes, as described in the previous example, and 65 weight percent of high density (0.93–0.94) polyethylene powder. The transfers are laid parallel to each other and spaced apart by about 2 inches, centered vertically on the vertical wall of the tank. The transfers are pressed against the surface of the tank to release the carrier sheets, and the resultant coated surface of the tank is heated to the melt temperature of polyethylene, 250 degrees F. briefly to permanently incorporate the conductive strips onto the surface of the tank. In this application, the conductive strips are layered on the surface of the tank, rather than being flush with the tank surface as in the previous example. Electrical contacts are attached to the strips and used to connect to a liquid level sensing instrument.

The invention has been described with reference to the illustrated and presently preferred embodiment. It is not intended that the invention be unduly limited by this disclosure of the preferred embodiment. Instead, it is Intended that the invention be defined by the elements, and their obvious equivalents, set forth in the following claims.

What is claimed is:

1. The method to apply an electrically conductive circuit into a polyethylene surface which comprises:
   a. forming a transfer by printing onto a flexible sheet carrier a coating with the electrically conductive circuit defined by a mixture consisting essentially of from 30 to 55 weight percent electrically conductive metal flakes and from 45 to 70 weight percent of a member selected from the group consisting of hydrocarbon waxes and high density polyethylene powder;
   b. transferring the coating from the sheet carrier to the polyethylene surface and heating the surface to the melting temperature of the polyethylene surface to fuse and permanently incorporate the coating into the polyethylene surface.

2. The method of claim 1 wherein the conductive metal flakes have a thickness of about 1 micron.

3. The method of claim 2 including the steps of forming said mixture with high density polyethylene powder having a size range less than 40 microns and transferring the printed coating from the carrier sheet of said transfer onto a polyethylene surface by pressing the transfer against the surface and separating the carrier sheet from the printed coating and heating said polyethylene to the melt temperature of the polyethylene powder to fuse the coating into said surface.

4. The method of claim 3 wherein the printing mixture comprises from 45 to 55 weight percent nickel metal flakes and from 55 to 45 weight percent high density polyethylene powder.

5. The method of claim 4 wherein the nickel flakes have a thickness of about 1 micron.

6. The method of claim 1 as applied to a rotational molding cycle wherein a rotational mold is charged with polyethylene molding resin, closed and heated to a molding temperature while rotating the mold about its major and minor axes for sufficient time to mold the resin against the interior surface of the mold and form a hollow-form part having said polyethylene surface, then cooled to a demolding temperature and opened and the part is ejected, including the steps of forming the transfer with said mixture and transferring the printed coating from the carrier sheet to the interior surface of the rotational mold at the demolding temperature prior to charging said mold with polyethylene molding resin.

7. The method of claim 6 including the step of forming said mixture with microcrystalline hydrocarbon wax.

8. The method of claim 7 wherein the printing mixture consists essentially of from 45 to 55 weight percent nickel metal flakes and from 45 to 55 weight percent wax.

9. The method of claim 8 wherein the nickel flakes have a thickness of about 1 micron.

10. The method of claim 1 wherein the printing mixture comprises from 45 to 55 weight percent nickel metal flakes and from 45 to 55 weight percent wax.

* * * * *